United States Patent
Shin

(10) Patent No.: US 12,317,673 B2
(45) Date of Patent: May 27, 2025

(54) ORGANIC LIGHT EMITTING DISPLAY DEVICE THAT DETECTS MOISTURE BY EMITTING LIGHT RESPONSIVE TO ULTRAVIOLET LIGHT IRRADIATION

(71) Applicant: LG Display Co., Ltd., Seoul (KR)

(72) Inventor: Jeongha Shin, Seoul (KR)

(73) Assignee: LG Display Co., Ltd., Seoul (KR)

( * ) Notice: Subject to any disclaimer, the term of this patent is extended or adjusted under 35 U.S.C. 154(b) by 345 days.

(21) Appl. No.: 17/549,523

(22) Filed: Dec. 13, 2021

(65) Prior Publication Data

US 2022/0199950 A1   Jun. 23, 2022

(30) Foreign Application Priority Data

Dec. 23, 2020   (KR) .................. 10-2020-0182407

(51) Int. Cl.
| | | |
|---|---|---|
| *H10K 50/844* | (2023.01) | |
| *H10K 50/84* | (2023.01) | |
| *H10K 50/842* | (2023.01) | |
| *H10K 85/10* | (2023.01) | |

(52) U.S. Cl.
CPC ....... *H10K 50/844* (2023.02); *H10K 50/8426* (2023.02); *H10K 50/846* (2023.02); *H10K 85/114* (2023.02)

(58) Field of Classification Search
CPC ............. H10K 50/844; H10K 50/8426; H10K 50/846; H10K 85/114
See application file for complete search history.

(56) References Cited

U.S. PATENT DOCUMENTS

| | | | |
|---|---|---|---|
| 9,551,678 B2 | 1/2017 | Suzuki | |
| 11,127,921 B2 | 9/2021 | Jung | |
| 11,600,797 B2 | 3/2023 | Jung | |
| 2005/0023976 A1 | 2/2005 | Wang | |
| 2006/0159867 A1* | 7/2006 | O'Donnell | ........ G02F 1/133308 349/56 |

(Continued)

FOREIGN PATENT DOCUMENTS

| | | |
|---|---|---|
| KR | 10-2006-0024459 A | 3/2006 |
| KR | 10-2015-0143316 A | 12/2015 |

(Continued)

OTHER PUBLICATIONS

English Translation Foreign Reference KR20160060264 (Year: 2016).*

(Continued)

*Primary Examiner* — William B Partridge
*Assistant Examiner* — David Paul Sedorook
(74) *Attorney, Agent, or Firm* — Fenwick & West LLP

(57) ABSTRACT

An organic light emitting display device includes a substrate which is divided into an active area and a non-active area. An adhesive film and an encapsulation substrate are disposed above the substrate, and a dam is disposed in the non-active area between the substrate and the encapsulation substrate. The dam includes a polymer light emitting material that is transparent when irradiated with visible light but emits light when irradiated with ultraviolet light. Therefore, external appearance of the dam can be inspected and performance of the dam can be evaluated using ultraviolet rays.

19 Claims, 10 Drawing Sheets

(56) References Cited

U.S. PATENT DOCUMENTS

| | | | | |
|---|---|---|---|---|
| 2008/0106194 A1* | 5/2008 | Logunov | ................ | B32B 17/06 |
| | | | | 445/25 |
| 2011/0114991 A1* | 5/2011 | Lee | .................... | H10K 50/8426 |
| | | | | 257/E33.059 |
| 2015/0362449 A1* | 12/2015 | Suzuki | ................ | G01N 27/121 |
| | | | | 257/40 |
| 2017/0279084 A1* | 9/2017 | Sakamoto | ............ | H10K 59/131 |
| 2020/0006697 A1* | 1/2020 | Jung | ................ | H10K 59/1213 |
| 2021/0167323 A1 | 6/2021 | Jung | | |

FOREIGN PATENT DOCUMENTS

| | | | | | |
|---|---|---|---|---|---|
| KR | 10-2016-0060264 A | | 5/2016 | | |
| KR | 20160060264 A | * | 5/2016 | ........... | H10K 50/846 |
| KR | 10-2018-0060676 A | | 6/2018 | | |
| KR | 10-2020-0003337 A | | 1/2020 | | |

OTHER PUBLICATIONS

Korean Intellectual Property Office, Office Action, Korean Patent Application No. 10-2020-0182407, Nov. 30, 2024, 16 pages.

\* cited by examiner

ORGANIC LIGHT EMITTING DISPLAY DEVICE THAT DETECTS MOISTURE BY EMITTING LIGHT RESPONSIVE TO ULTRAVIOLET LIGHT IRRADIATION

CROSS-REFERENCE TO RELATED APPLICATIONS

This application claims the priority benefit of Republic of Korea Patent Application No. 10-2020-0182407 filed on Dec. 23, 2020, which is incorporated by reference in its entirety.

BACKGROUND

Technical Field

The present disclosure relates to an organic light emitting display device, and more particularly, to a transparent organic light emitting display device.

Description of the Related Art

Currently, as it enters a full-scale information era, a field of a display device which visually expresses electrical information signals has been rapidly developed and studies are continued to improve performances of various display devices such as a thin thickness, a light weight, and a low power consumption.

Examples of display devices include a liquid crystal display device (LCD), an electro-wetting display device (EWD), an organic light emitting display device (OLED), and the like.

Among them, the organic light emitting display device is a self-emitting display device so that a separate light source is not necessary, which is different from the liquid crystal display device. Therefore, the organic light emitting display device may be manufactured to have light weight and thin thickness. Further, since the organic light emitting display device is advantageous not only in terms of power consumption due to the low voltage driving, but also in terms of color implementation, response speed, viewing angle, and contrast ratio (CR), it is expected to be utilized in various fields.

The organic light emitting display device is configured by disposing a light emitting layer which uses an organic material between two electrodes referred to as an anode and a cathode. When holes in the anode are injected to the light emitting layer and electrons in the cathode are injected to the light emitting layer, the injected holes and electrons are recombined and form exciton in the light emitting layer to emit light.

Such a light emitting layer includes a host material and a dopant material so that interactions between two materials occur. The host serves to generate excitons from the electrons and holes and transmit energy to the dopant. The dopant is a dye organic material and a small amount of dopant is added to receive energy from the host and convert the energy into light.

SUMMARY

When the organic compounds of the organic light emitting diode are exposed to moisture, characteristics of the organic compounds are rapidly degraded. Accordingly, it is very important to block moisture flowing into the pixels in order to improve the reliability of the organic light emitting display device and extend the lifespan. The organic light emitting display device suppresses the degradation of the organic light emitting diode from permeation of the moisture and oxygen using an encapsulation technique which seals the organic light emitting diode from the external environment.

A dam used in the encapsulation technique of a top emission type organic light emitting display device is configured by a resin including a getter to block moisture permeating through a side surface.

In the related art, an opaque material is used for the getter so that it is easy to inspect an external appearance of the dam and it is easy to evaluate a performance of the dam using a characteristic that the getter absorbs moisture to be transparent.

In the meantime, in accordance with a demand of a transparent bezel for the transparent display device, a transparent getter and resin are being developed so that an inspection method which is applicable to a transparent dam material is necessary.

Therefore, an object to be achieved by the present disclosure is to provide an organic light emitting display device including a transparent dam for which an external appearance inspection and reliability evaluation are possible.

Objects of the present disclosure are not limited to the above-mentioned objects, and other objects, which are not mentioned above, can be clearly understood by those skilled in the art from the following descriptions.

In order to achieve the above-described object, according to an aspect of the present disclosure, an organic light emitting display device includes a substrate which is divided into an active area and a non-active area, an adhesive film and an encapsulation substrate disposed above the substrate and a dam disposed in the non-active area between the substrate and the encapsulation substrate, wherein the dam includes a polymer light emitting material that is transparent when irradiated with visible light but emits light when irradiated with ultraviolet light.

According to another aspect of the present disclosure, an organic light emitting display device includes a substrate which is divided into an active area and a non-active area, an adhesive film and an encapsulation substrate disposed above the substrate, a dam disposed in the non-active area between the substrate and the encapsulation substrate and a light emitting layer disposed between the dam and the substrate.

According to still another aspect of the present disclosure, an organic light emitting display device includes a substrate which is divided into an active area and a non-active area, an adhesive film and an encapsulation substrate disposed above the substrate and a dam disposed in the non-active area between the substrate and the encapsulation substrate, the dam includes a first dam and a second dam disposed in the first dam and the first dam further includes a polymer light emitting material that is transparent when irradiated with visible light but emits light when irradiated with ultraviolet light compared to the second dam.

Other detailed matters of the exemplary embodiments are included in the detailed description and the drawings.

According to the present disclosure, a fluorescent material and a light emitting material are added to a transparent dam material to inspect the external appearance of the dam and evaluate the performance of the transparent dam using ultraviolet rays.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
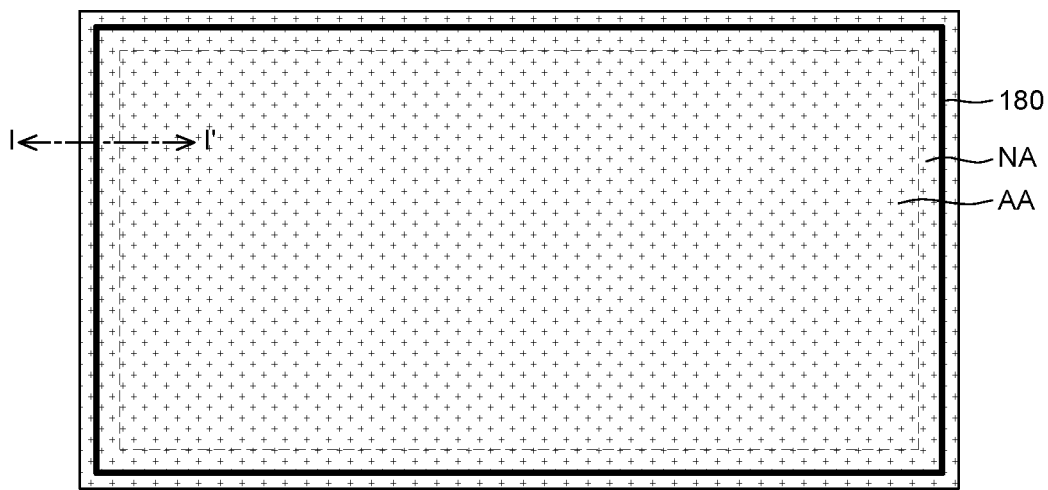
FIG. 1 is a plan view of an organic light emitting display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

FIG. 1 is a plan view of an organic light emitting display device according to a first exemplary embodiment of the present disclosure.

Referring to FIG. 1, an organic light emitting display device according to the first exemplary embodiment of the present disclosure may include a display panel 100.

The display panel 100 is a panel for displaying images to a user.

The display panel 100 may include a display element which displays images, a driving element which drives the display element, wiring lines which transmit various signals to the display element and the driving element, and the like. The display element may be defined in different ways depending on a type of the display panel 100. For example, when the display panel 100 is an organic light emitting display panel, the display element may be an organic light emitting diode which includes an anode, an organic light emitting layer, and a cathode. For example, when the display panel 100 is a liquid crystal display panel, the display element may be a liquid crystal display element. Hereinafter, even though the display panel 100 is assumed as an organic light emitting display panel, the display panel 100 is not limited to the organic light emitting display panel.

The display panel 100 includes an active area AA and a non-active area NA.

The active area AA is an area where images are displayed in the display panel 100.

In the active area AA, a plurality of sub pixels which configures the plurality of pixels and a circuit for driving the plurality of sub pixels may be disposed. The plurality of sub pixels is minimum units which configure the active area AA and a display element may be disposed in each of the plurality of sub pixels. The plurality of sub pixels may configure a pixel. For example, an organic light emitting diode which includes an anode, an organic light emitting layer, and a cathode may be disposed in each of the plurality of sub pixels, but it is not limited thereto. Further, a circuit for driving the plurality of sub pixels may include a driving element, a wiring line, and the like. For example, the circuit may be configured by a thin film transistor, a storage capacitor, a gate line, a data line, and the like, but is not limited thereto.

The non-active area NA is an area where no image is displayed.

Even though in FIG. 1, it is illustrated that the non-active area NA encloses a quadrangular active area AA, shapes and placements of the active area AA and the non-active area NA are not limited to the example illustrated in FIG. 1.

In other words, the active area AA and the non-active area NA may have shapes suitable for a design of an electronic device mounted with the organic light emitting display device. For example, an exemplary shape of the active area AA may be a pentagon, a hexagon, a circle, an oval, or the like.

In the non-active area NA, various wiring lines and circuits for driving the organic light emitting diode of the active area AA are disposed. For example, in the non-active area NA, a link line which transmits signals to the plurality of sub pixels and circuits of the active area AA or a driving IC such as a gate driver IC or a data driver IC may be disposed, but it is not limited thereto.

The organic light emitting display device may further include various additional elements to generate various signals or drive the pixel in the active area AA. The additional elements for driving the pixels may include an inverter circuit, a multiplexer, an electrostatic discharge circuit (ESD), or the like. The organic light emitting display device may also include an additional element associated with a function other than a pixel driving function. For example, the organic light emitting display device may include additional elements which provide a touch sensing function, a user authentication function (for example, fingerprint recognition), a multilevel pressure sensing function, a tactile feedback function, or the like. The above-mentioned additional elements may be located in the non-active area NA and/or an external circuit which is connected to the connecting interface.

In the meantime, the organic light emitting display device according to the first exemplary embodiment of the present disclosure may include a dam 180 in the non-active area NA to ensure a reliability such as suppression of moisture permeation.

The dam 180 according to the first exemplary embodiment of the present disclosure is configured to include a transparent getter and a resin to implement a transparent display device. Further, a fluorescent material and a light emitting material are additionally included for the purpose of external appearance inspection and reliability evaluation. Various configurations including the dam 180 which configure an organic light emitting display device will be described in detail with reference to FIGS. 2 to 4.

Figure 2:
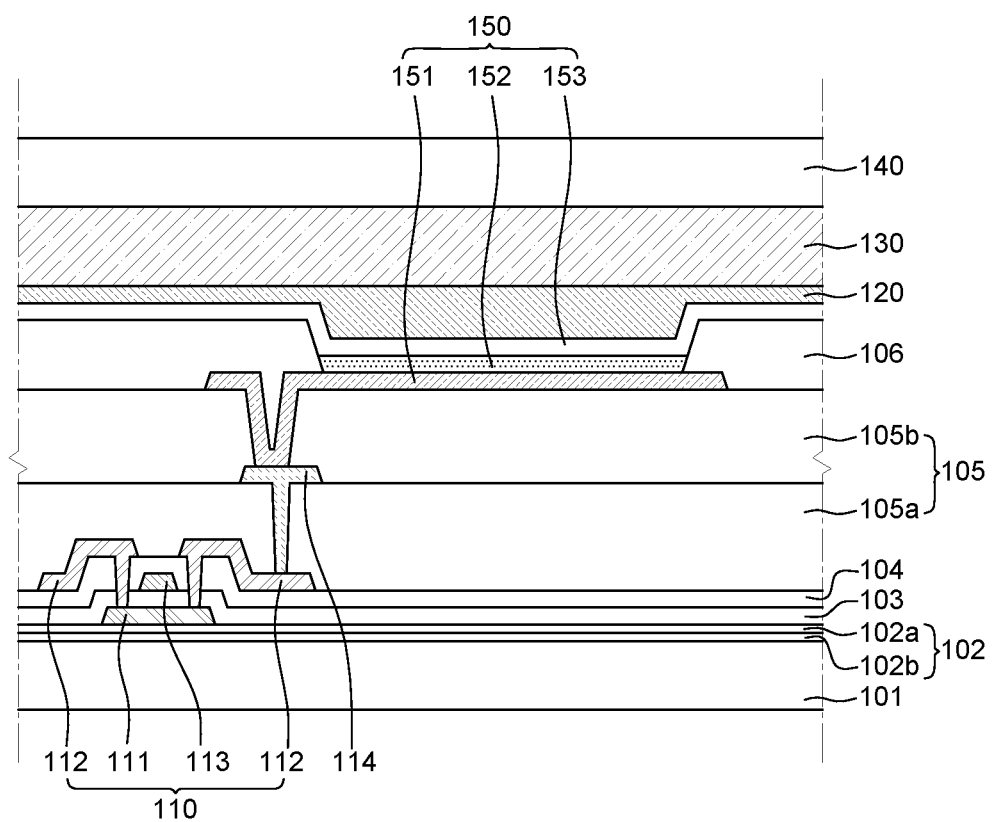
FIG. 2 is a cross-sectional view of a sub pixel of an organic light emitting display device according to the first exemplary embodiment of the present disclosure.

FIG. 2 is a cross-sectional view of a sub pixel of an organic light emitting display device according to the first exemplary embodiment of the present disclosure.

Figure 3:
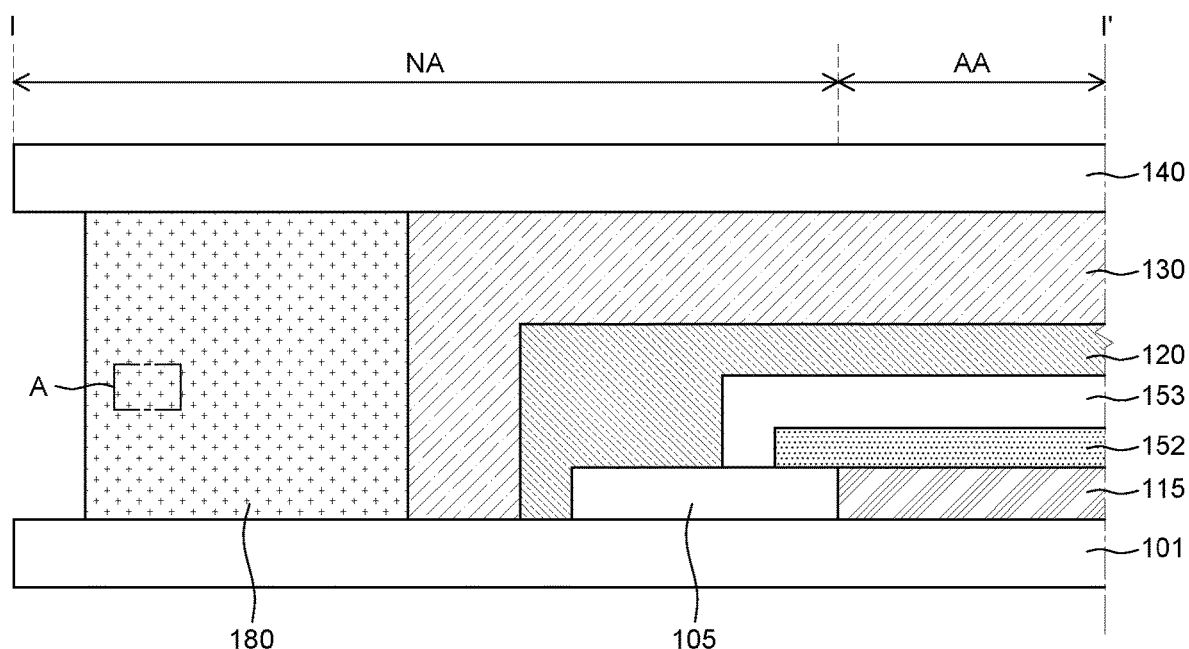
FIG. 3 is a cross-sectional view taken along the line I-I' of FIG. 1 according to the first exemplary embodiment of the present disclosure.

FIG. 3 is a cross-sectional view taken along the line I-I' of FIG. 1 according to the first exemplary embodiment of the present disclosure.

Figure 4:
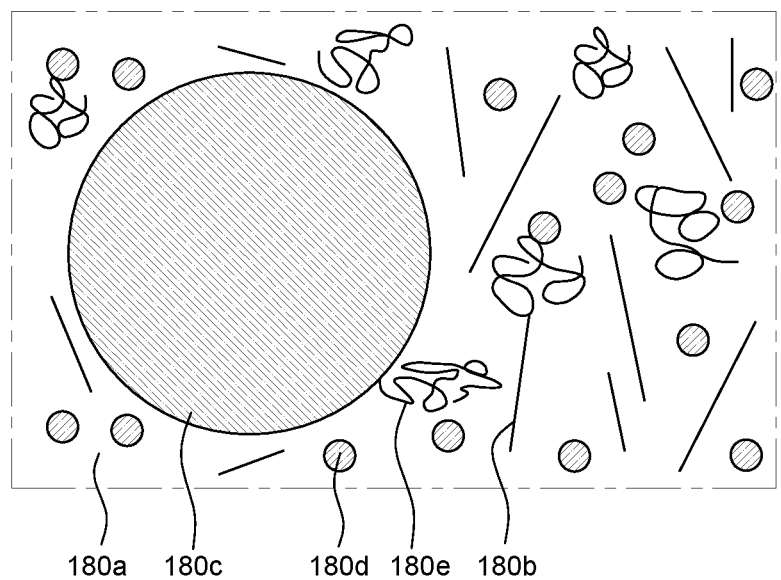
FIG. 4 is an enlarged view of A of FIG. 3 according to the first exemplary embodiment of the present disclosure.

FIG. 4 is an enlarged view of A of FIG. 3 according to the first exemplary embodiment of the present disclosure.

FIG. 3 illustrates a cross-section of a part of a right side of the display panel 100 in which the dam 180 is formed, as an example.

In FIG. 3, for the convenience of description, the pixel unit 115 in the active area AA is schematically illustrated. The pixel unit 115 may include various configurations below the organic layer 152.

Referring to FIGS. 2 to 4, in the organic light emitting display device according to the first exemplary embodiment of the present disclosure, a driving element 110 is disposed on the substrate 101.

A planarization layer 105 is disposed on the driving element 110.

Further, an organic light emitting diode 150 which is electrically connected to the driving element 110 is disposed on the planarization layer 105 and a passivation layer 120 is disposed on the organic light emitting diode 150 to suppress oxygen and moisture from permeating into the organic light emitting diode 150.

An adhesive film 130 and an encapsulation substrate 140 are sequentially disposed on the passivation layer 120. However, the present disclosure is not limited to such a lamination structure.

The substrate 101 may be a glass or plastic substrate. When the substrate is a plastic substrate, polyimide-based or polycarbonate-based materials are used so that the substrate may have a flexibility. Specifically, polyimide may be applied to a high temperature process and may be coated so that polyimide may be frequently used for the plastic substrate.

A buffer layer 102 is disposed on the substrate 101.

The buffer layer 102 is a functional layer which protects various electrodes and wiring lines from impurities such as alkali ions leaked from the substrate 101 or layers there below and has a multi-layered structure which is formed by a first buffer layer 102a and a second buffer layer 102b, but is not limited thereto. The buffer layer 102 may be formed of silicon oxide SiOx, silicon nitride SiNx, or multiple layers thereof.

The buffer layer 102 may delay the diffusion of moisture and/or oxygen which permeates the substrate 101. The buffer layer 102 may include a multi buffer and/or an active buffer. The active buffer may perform a function of protecting an active layer 111 of the driving element 110 configured by a semiconductor and blocking various types of defects introduced from the substrate 101. The active buffer may be formed of amorphous silicon (a-Si), or the like.

The driving element 110 may be formed by sequentially disposing an active layer 111, an insulating layer 103, a gate electrode 113, a gate insulating layer 104, a source electrode and a drain electrode 112 and is electrically connected to the organic light emitting diode 150 via the connection electrode 114. Therefore, the driving element 110 may transmit a current or signal to the organic light emitting diode 150.

The active layer 111 may be located on the buffer layer 102. The active layer 111 may be made of poly silicon p-Si. In this case, a predetermined region may be doped with impurities. Further, the active layer 111 may be made of amorphous silicon (a-Si) or an organic semiconductor material such as pentacene. Moreover, the active layer 111 may be made of oxide.

The insulating layer 103 may be located on the active layer 111. The insulating layer 103 may be formed of an insulating inorganic material such as silicon oxide SiOx or silicon nitride SiNx, and may also be formed of an insulating organic material.

The gate electrode 113 is located on the insulating layer 103. The gate electrode 113 may be formed of various conductive materials, for example, magnesium (Mg), aluminum (Al), nickel (Ni), chrome (Cr), molybdenum (Mo), tungsten (W), gold (Au), or an alloy thereof.

The gate insulating layer 104 may be disposed on the gate electrode 113. The gate insulating layer 104 may be formed of an insulating material such as silicon oxide (SiOx) or silicon nitride (SiNx), and may also be formed of other insulating organic materials.

The insulating layer 103 and the gate insulating layer 104 are selectively removed to form a contact hole through which the source and drain regions are exposed. The source electrode and the drain electrode 112 may be formed of a material for an electrode, on the gate insulating layer 104 as a single layer or a multi-layered structure. If necessary, an additional passivation layer which is configured with an inorganic insulating material may be formed to cover the source electrode and drain electrode 112.

A planarization layer 105 is disposed on the driving element 110 configured as described above.

The planarization layer 105 may have a multi-layered structure configured by at least two layers and for example, referring to FIG. 2, may include a first planarization layer 105a and a second planarization layer 105b. The first planarization layer 105a may be disposed to cover the driving element 110, but expose a part of the source electrode and the drain electrode 112 of the driving element 110.

The planarization layer 105 may extend to the non-active area NA.

The planarization layer 105 may be an overcoat layer, but is not limited thereto.

The connection electrode 114 may be disposed on the first planarization layer 105a to electrically connect the driving element 110 and the organic light emitting diode 150. Further, even though not illustrated in FIG. 2, various metal layers which serve as electric wires/electrodes such as a data line or a signal line may be disposed on the first planarization layer 105a.

Further, the second planarization layer 105b may be disposed on the first planarization layer 105a and the connection electrode 114. The planarization layer 105 of the first exemplary embodiment of the present disclosure is configured by two layers because as the resolution of the organic light emitting display device is increased, various signal lines are increased. Therefore, it is difficult to dispose all the wiring lines on one layer while ensuring a minimum interval so that an additional layer is provided. The additional layer (the second planarization layer 105b) is added so that there is a margin for disposing wiring lines, which makes it easier to design and dispose the wiring lines/electrodes. Further, when a dielectric material is used for the planarization layer 105 configured by a plurality of layers, the planarization layer 105 may be utilized to form a capacitance between metal layers.

The second planarization layer 105b may be formed to expose a part of the connection electrode 114 and the drain electrode 112 of the driving element 110 and the anode 151 of the organic light emitting diode 150 may be electrically connected by the connection electrode 114.

The organic light emitting diode 150 may be configured by sequentially disposing the anode 151, the plurality of organic layers 152, and the cathode 153. That is, the organic light emitting diode 150 may be configured by the anode 151 formed on the planarization layer 105, the organic layer 152 formed on the anode 151, and the cathode 153 formed on the organic layer 152.

The organic light emitting display device may be implemented as a top emission type or a bottom emission type. In the case of the top emission type, a reflective layer may be formed below the anode 151 to allow light emitted from the organic layer 152 to be reflected by the anode 151 to be directed upwardly, that is, directed to the cathode 153 there above. The reflective layer may be formed of an opaque conductive material having a high reflectance, such as silver (Ag), aluminum (Al), gold (Au), molybdenum (Mo), tungsten (W), chrome (Cr), or an alloy thereof. In contrast, in the case of the bottom emission type, the anode 151 may be only formed of a transparent conductive material such as indium tin oxide (ITO), indium zin oxide (IZO), or indium gallium zinc oxide (IGZO). Hereinafter, the description will be made by assuming that the organic light emitting display device of the present disclosure is a top emission type.

A bank 106 may be formed in a remaining area excluding the emission area on the planarization layer 105. Therefore, the bank 106 has a bank hole which exposes the anode 151 corresponding to the emission area. The bank 106 may be formed of an inorganic insulating material such as silicon nitride (SiNx) or silicon oxide (SiOx) or an organic insulating material such as BCB, an acrylic resin or an imide resin.

The bank 106 may extend to the non-active area NA.

The organic layer 152 may be disposed on the anode 151 exposed by the bank 106. The organic layer 152 may include a light emitting layer, an electron injection layer, an electron transport layer, a hole transport layer, and a hole injection layer.

The organic layer 152 may extend to the non-active area NA.

The organic layer 152 may be disposed on the planarization layer 105 in the non-active area NA.

The cathode 153 is disposed on the organic layer 152.

In the case of the top emission type, the cathode 153 may include a transparent conductive material. For example, the cathode 153 may be formed of indium tin oxide (ITO), indium zin oxide (IZO), indium gallium zinc oxide (IGZO), or the like. In the case of the bottom emission type, the cathode 153 may include metal materials such as gold (Au), silver (Ag), aluminum (Al), molybdenum (Mo), magnesium (Mg), palladium (Pd), copper (CU), or an alloy thereof. Alternatively, the cathode 153 may be configured by laminating a layer formed of a transparent conductive layer such as indium tin oxide (ITO), indium zinc oxide (IZO), or indium gallium zinc oxide (IGZO) and a layer formed of a metal material such as gold (Au), silver (Ag), aluminum (Al), molybdenum (Mo), magnesium (Mg), palladium (Pd), copper (CU), or an alloy thereof, but is not limited thereto.

The cathode 153 may extend to the non-active area NA.

The cathode 153 may be disposed to cover the organic layer 152 in the non-active area NA.

The organic layer 152 may be disposed to be spaced apart from an end of the cathode 153 with a predetermined distance, but is not limited thereto.

The cathode 153 may be disposed to be spaced apart from an end of the planarization 105 with a predetermined distance, but is not limited thereto.

The passivation layer 120 may be disposed on the cathode 153.

Even though not illustrated in the drawing, a capping layer may be disposed on the organic light emitting diode 150. The capping layer may be formed of a material having a high refractive index and optical absorbance to reduce scattered reflection of external light.

The passivation layer 120 may be an inorganic layer and in this case, may be formed of silicon oxide SiOx, silicon nitride SiNx, or multiple layers thereof.

The passivation layer 120 may extend to the non-active area NA.

The passivation layer 120 may be disposed to cover the cathode 153 and the planarization layer 105.

An adhesive film 130 and an encapsulation substrate 140 may be disposed on the passivation layer 120.

The adhesive film 130 may be disposed to enclose the passivation layer 120.

The adhesive film 130 may protect the organic light emitting diode 150 of the pixel unit 115 from moisture, oxygen, and impacts of the outside together with the passivation layer 120 and the encapsulation substrate 140. The adhesive film 130 may further include an absorbent. The absorbent may be particles having hygroscopicity and absorb moisture and oxygen from the outside to minimize permeation of the moisture and oxygen into the pixel unit 115, but is not limited thereto.

The adhesive film 130 may include a filler.

The filler may be formed using a transparent material so as not to degrade the luminance while light emitted from the organic light emitting diode 150 passes through the encapsulation substrate 140. For example, the filler may be configured by at least one of epoxy, olefin, talc, calcium oxide (CaO), barium oxide (BaO), zeolite, silicon oxide (SiO), or the like.

The encapsulation substrate 140 may be disposed on the adhesive film 130. The encapsulation substrate 140 may protect the organic light emitting diode 150 of the pixel unit 115 together with the adhesive film 130. The encapsulation substrate 140 may protect the organic light emitting diode 150 from moisture, oxygen, and impacts of the outside.

A dam 180 is disposed between the substrate 101 and the encapsulation substrate 140 at an edge of the substrate 101 to reinforce the adhesiveness between the substrate 101 and the encapsulation substrate 140 and block moisture.

The dam 180 may be disposed in the non-active area NA at the outer periphery of the active area AA. That is, the dam 180 is formed to enclose the pixel unit 115 on the plane and bonds the substrate 101 and the encapsulation substrate 140 together with the adhesive film 130 to be sealed.

The dam 180 of the present disclosure may be configured with transparent materials to implement a transparent display device.

The dam 180 may include a sealant 180a and a filler 180b dispersed in the sealant 180a.

The sealant 180a may be a thermo-curable or UV curable sealant.

For example, the sealant 180a may be selected from an epoxy or acrylic sealant to which a thermal curing accelerator and/or a photo-initiator are added, but is not limited thereto.

In order to implement a transparent dam 180, the sealant 180a may be configured by a transparent material, but is not limited thereto.

The sealant 180a bonds edges of the substrate 101 and the encapsulation substrate 140 to reinforce the adhesiveness therebetween.

The filler 180b may be configured by a material which absorbs moisture and is ground to have a small size to be uniformly dispersed in the sealant 180a.

The filler 180b is not limited to a specific material, for example, but may be produced by alkali metal oxide, silica, porous zeolite, or other organic or inorganic moisture absorbent. A moisture reactive adsorbent may include one or more mixtures of metal powder such as alumina, metal oxide, metal salt, or phosphorous pentoxide ($P_2O_5$) and a physical adsorbent may include silica, zeolite, titania, zirconia, or montmorillonite.

Here, a specific example of the metal oxide may include lithium oxide $Li_2O$, sodium oxide ($Na_2O$), barium oxide (BaO), calcium oxide (CaO), magnesium oxide (MgO), or the like.

Examples of metal salts include sulfates such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), metal halides such as calcium chloride ($CaCl_2$), magnesium chloride ($MgCl_2$), strontium chloride ($SrCl_2$), yttrium chloride ($YCl_3$), magnesium bromide ($MgBr_2$), copper chloride ($CuCl_2$), cesium fluoride (CsF), tantalum fluoride ($TaF_5$), magnesium iodide ($MgI_2$), niobium fluoride ($NbF_5$), lithium bromide (LiBr), calcium bromide ($CaBr_2$), cesium bromide ($CeBr_3$), selenium bromide ($SeBr_4$) or vanadium bromide ($VBr_3$), or metal chlorates such as barium perchlorate ($Ba(ClO_4)_2$) or magnesium perchlorate ($Mg(ClO_4)_2$), but is not limited thereto.

In order to implement a transparent dam 180, the filler 180b may be configured by a transparent material, but is not limited thereto.

As illustrated in FIG. 4, the dam 180 may further include a spacer 180c.

Even though the spacer 180c is not limited to a specific material, for example, the spacer may be produced by glass fiber, silicon oxide ($SiO_2$) rod or power, or a carbon material. The spacer 180c is processed to be larger than the filler 180b to be dispersed in the sealant 180a.

The spacer 180c may restrict the gap between the substrate 101 and the encapsulation substrate 140 in the dam 180. Therefore, the spacer 180c may suppress the collapse of the dam 180 due to the pressure when the substrate 101 and the encapsulation substrate 140 are bonded.

In order to implement a transparent dam 180, the spacer 180c may be configured by a transparent material, but is not limited thereto.

The dam 180 according to the first exemplary embodiment of the present disclosure may further include a getter 180d.

The getter 180d may include at least one of barium oxide (BaO), calcium oxide (CaO), magnesium oxide (MgO), magnesium sulfate ($MgSO_4$), sodium oxide ($Na_2O$), sodium sulfate ($Na_2SO_4$), lithium sulfate (LiSO), calcium sulfate ($CaSO_4$), potassium oxide ($K_2O$), lithium oxide ($Li_2O$), gallium sulfate (GaS), calcium chloride ($CaCl_2$), magnesium chloride ($MgCl_2$), calcium bromide ($CaBr_2$), cerium bromide (CsBr), vanadium bromide ($VBr_5$), and calcium nitrate ($Ca(NO_3)_2$).

The getter 180d may be formed of particles having a size of 50 to 100 nm.

For example, the getter 180d may be physically mixed in the sealant 180a using a ball mill or an ultrasonic dispersion technique, but is not limited thereto.

In order to implement a transparent dam 180, the getter 180d may be configured by a transparent material, but is not limited thereto.

The dam 180 according to the first exemplary embodiment of the present disclosure may further include a polymer light emitting material 180e.

The polymer light emitting material 180e may be dissolved in the solvent to be dispersed in the transparent sealant 180a.

The polymer light emitting material 180e may be utilized as an indicator for external appearance inspection and reliability evaluation of the transparent dam 180. That is, the polymer light emitting material 180e is transparent in a visible ray region so that the transmittance of the transparent dam 180 is not degraded and when the ultraviolet ray is irradiated on the polymer light emitting material 180e, the polymer light emitting material 180e emits light. Therefore, it is possible to inspect the external appearance of the dam 180 by irradiating the ultraviolet ray using this characteristic.

When the polymer light emitting material 180e is exposed to the moisture, the polymer light emitting material deteriorates so that the emission characteristic is degraded. Therefore, the polymer light emitting material 180e may be used to evaluate the performance of the dam 180.

For example, the polymer light emitting material 180e may include at least one of polythiophene (PTh) and derivatives thereof, poly-p-phenylenevinylene (PPV) and derivatives thereof, poly-p-phenylene (PPP) and derivatives thereof, polyfluorene (PF) and derivatives thereof, and polyarylenevinylene (PAV) and derivatives thereof.

The polymer light emitting material 180e may be dissolved and dispersed in the solvent, that is, the sealant 180a. For example, the polymer light emitting material 180e may be physically mixed in the sealant 180a using a ball mill or an ultrasonic dispersion technique, but is not limited thereto.

As described above, when the transparent dam 180 is applied to implement the transparent display device, the external appearance inspection and the performance evaluation of the display panel 100 may not be performed according to the related art. That is, in the related art, an opaque material including the getter is used for the dam so that it is easy to inspect an external appearance of the dam and it is easy to evaluate a performance of the dam using a characteristic that the opaque getter absorbs moisture to be transparent. However, in the transparent display device, a transparent bezel is requested so that the transparent getter 180d and the sealant 180a are used as the material of the dam 180 and thus an inspection method which is applicable to the transparent dam 180 may be used.

Therefore, according to the first exemplary embodiment of the present disclosure, the polymer light emitting material 180e which is transparent in the visible ray region so that the transmittance of the transparent dam 180 is not degraded and emits light by irradiating ultraviolet rays is added to the material of the transparent dam 180.

According to the first exemplary embodiment of the present disclosure, the ultraviolet ray is irradiated onto the display panel 100 to inspect the external appearance of the dam 180. Further, a characteristic of the polymer light emitting material 180e when the polymer light emitting material 180e reacts with moisture is that a degree of fluorescence changes. When the polymer light emitting material 180e reacts with the moisture, the luminescence lost is used to evaluate the performance of the dam 180.

That is, excitons formed when the ultraviolet rays are irradiated on the display panel 100 of the present disclosure returns to a stable state to generate light in a specific wavelength band which is unique to the material so that the transparent dam 180 area emits light and thus the width of the dam 180 may be easily managed.

Further, in an area in which the moisture permeates, the polymer light emitting material 180e is degraded to be visible, that is, the distance at which the dam 180 absorbs the moisture is visible so that the moisture permeation distance is measured to easily evaluate a moisture absorption performance of the material.

Figure 5A:
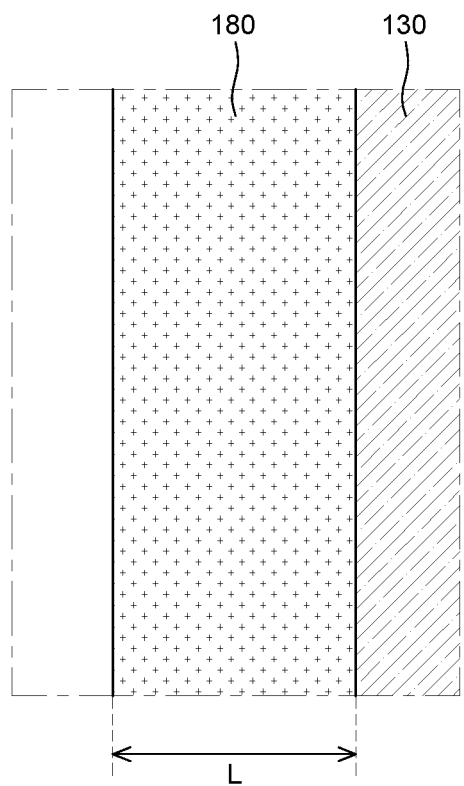
FIGS. 5A and 5B are partial cross-sectional views of an organic light emitting display device of FIG. 3 according to the first exemplary embodiment of the present disclosure.
Figure 5B:
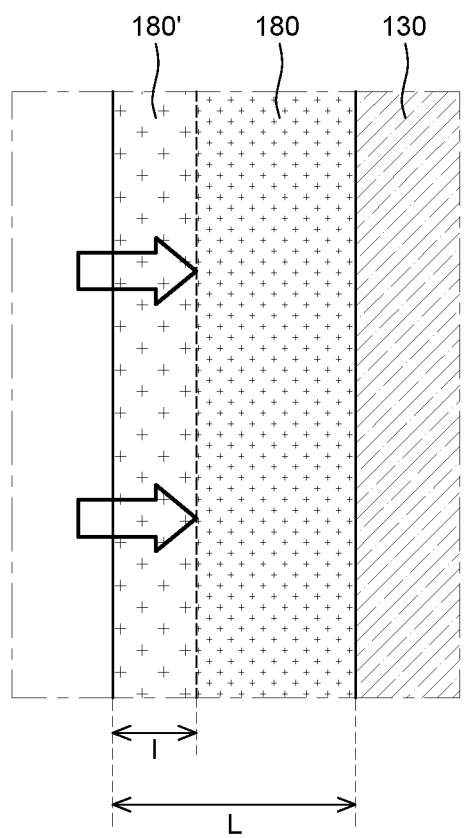

FIGS. 5A and 5B are partial cross-sectional views of an organic light emitting display device of FIG. 3 according to the first exemplary embodiment of the present disclosure.

FIG. 5A is a cross-sectional view of a display panel when moisture does not permeate into the dam 180 and FIG. 5B is a cross-sectional view of a display panel when moisture permeates into the dam 180.

Referring to FIG. 5A, when the moisture does not permeate into the dam 180, it is understood that when the ultraviolet ray is irradiated, the polymer light emitting material in the dam 180 is never deteriorated so that the dam 180 is visible in the entire length L. At this time, the polymer light emitting material emits light by irradiating the ultraviolet rays so that the width and the external appearance of the dam 180 including the polymer light emitting material may be inspected.

In contrast, referring to FIG. 5B, when the moisture permeates into the dam 180 (see the arrow), if the ultraviolet ray is irradiated, some of the polymer light emitting material in the dam 180 react with the moisture so that the degree of fluorescence is changed or the luminescence is lost. Therefore, the deteriorated dam 180' which shows emission difference from the dam 180 may be visible so that the moisture permeation distance 1 may be confirmed.

Figure 6:
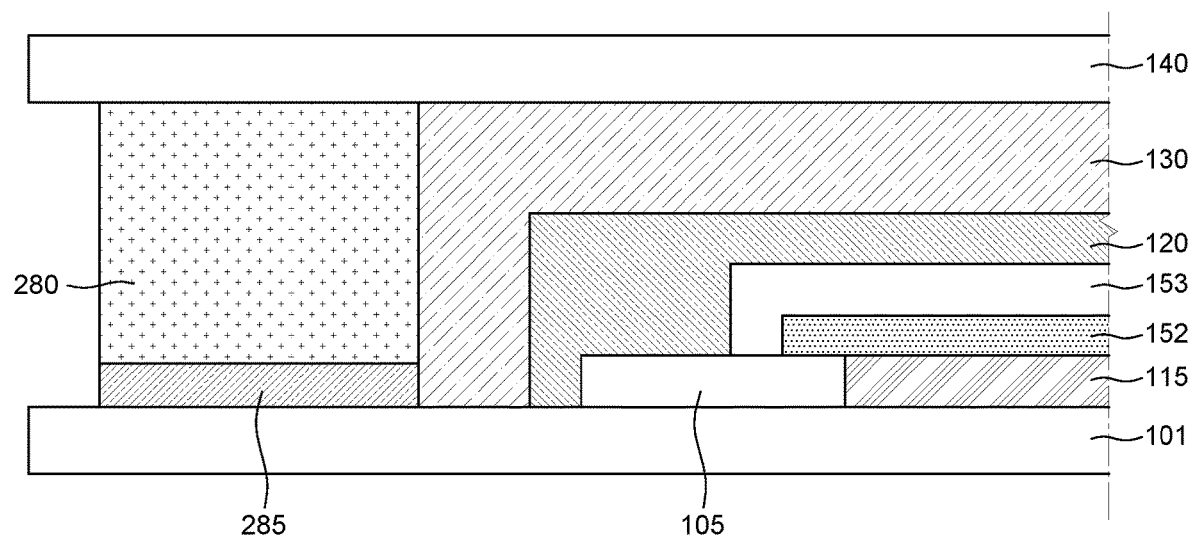
FIG. 6 is a cross-sectional view of an organic light emitting display device according to a second exemplary embodiment of the present disclosure.

FIG. 6 is a cross-sectional view of an organic light emitting display device according to a second exemplary embodiment of the present disclosure.

A second exemplary embodiment of the present disclosure of FIG. 6 has configurations of a dam 280 and a light emitting layer 285 different from those of the organic light emitting display device of the first exemplary embodiment of the present disclosure of FIG. 3, but other configurations are substantially the same. Therefore, redundant description is omitted. The same configuration will be denoted with the same reference numeral.

Referring to FIG. 6, a dam 280 may be disposed between the substrate 101 and the encapsulation substrate 140 at an edge of the substrate 101.

Further, according to the second exemplary embodiment of the present disclosure, the light emitting layer 285 is provided below the dam 280. In this case, the dam 280 may not include a polymer light emitting material, but is not limited thereto.

The dam 280 may be formed to enclose the pixel unit 115 on the plane.

The dam 280 according to the second exemplary embodiment of the present disclosure may be configured with transparent materials to implement a transparent display device.

The dam 280 may include a sealant and a filler dispersed in the sealant.

The dam 280 may further include a spacer and a getter.

The light emitting layer 285 may be configured by the above-described polymer light emitting material.

Alternatively, the light emitting layer 285 may be configured by a light emitting material of an organic layer.

The light emitting layer 285 may be utilized as an indicator for external appearance inspection and reliability evaluation of the transparent dam 280.

The polymer light emitting material may include at least one of polythiophene PTh and derivatives thereof, poly-p-phenylenevinylene PPV and derivatives thereof, poly-p-phenylene PPP and derivatives thereof, polyfluorene PF and derivatives thereof, and polyarylenevinylene PAV and derivatives thereof.

Figure 7:
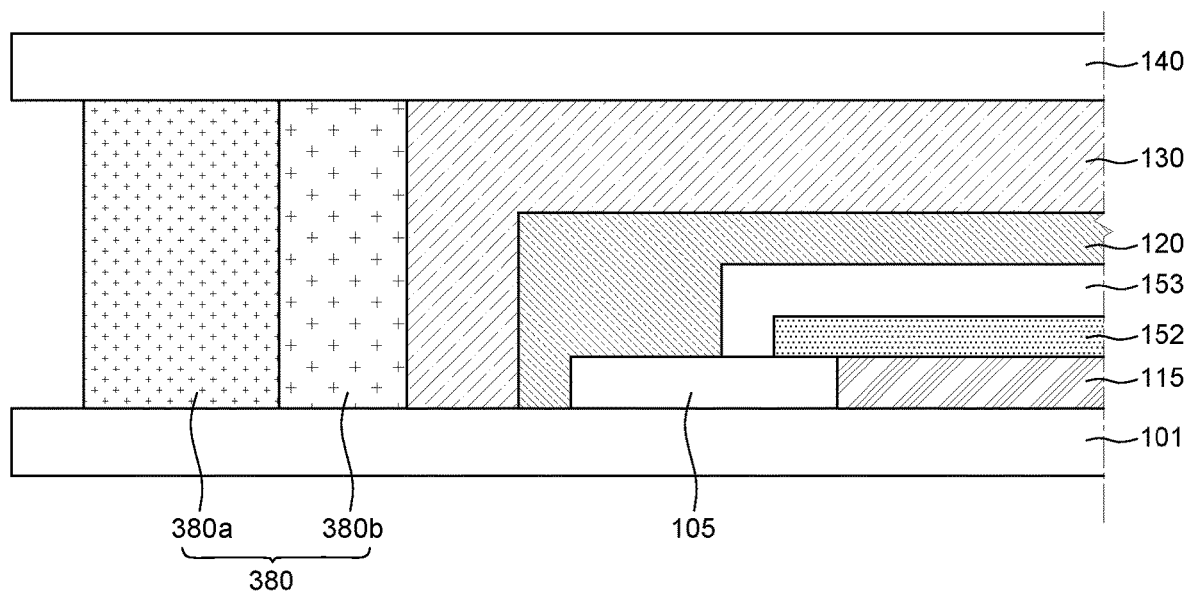
FIG. 7 is a cross-sectional view of an organic light emitting display device according to a third exemplary embodiment of the present disclosure.

FIG. 7 is a cross-sectional view of an organic light emitting display device according to a third exemplary embodiment of the present disclosure.

A third exemplary embodiment of the present disclosure of FIG. 7 has a configuration of a dam 380 different from that of the organic light emitting display device according to the first exemplary embodiment of the present disclosure of FIG. 3, but other configurations are substantially the same. Therefore, redundant description is omitted. The same configuration will be denoted with the same reference numeral.

Referring to FIG. 7, a dam 380 may be disposed between the substrate 101 and the encapsulation substrate 140 at an edge of the substrate 101.

The dam 380 according to the third exemplary embodiment of the present disclosure is configured by a dual dam including a first dam 380a and a second dam 380b provided in the first dam 380a.

The first dam 380a and the second dam 380b are in contact with each other, but are not limited thereto.

A width of the first dam 380a may be set in consideration of the moisture permeation distance and the first dam may be disposed at the outside of the second dam 380b. For example, when the measured moisture permeation distance is X, the first dam 380a may have a width longer than X.

The first dam 380a may include the polymer light emitting material more than that of the second dam 380b. That is, the first dam 380a may be utilized as an indicator for external appearance inspection and reliability evaluation of the transparent dam 380.

The dam 380 may be formed to enclose the pixel unit 115 on the plane.

The dam 380 according to the third exemplary embodiment of the present disclosure may be configured with transparent materials to implement a transparent display device.

The dam 380 may include a sealant and a filler dispersed in the sealant.

The dam 380 may further include a spacer and a getter.

The first dam 380a may further include a polymer light emitting material.

The polymer light emitting material may include at least one of polythiophene (PTh) and derivatives thereof, poly-p-phenylenevinylene (PPV) and derivatives thereof, poly-p-phenylene (PPP) and derivatives thereof, polyfluorene (PF) and derivatives thereof, and polyarylenevinylene (PAV), and derivatives thereof.

Figure 8:
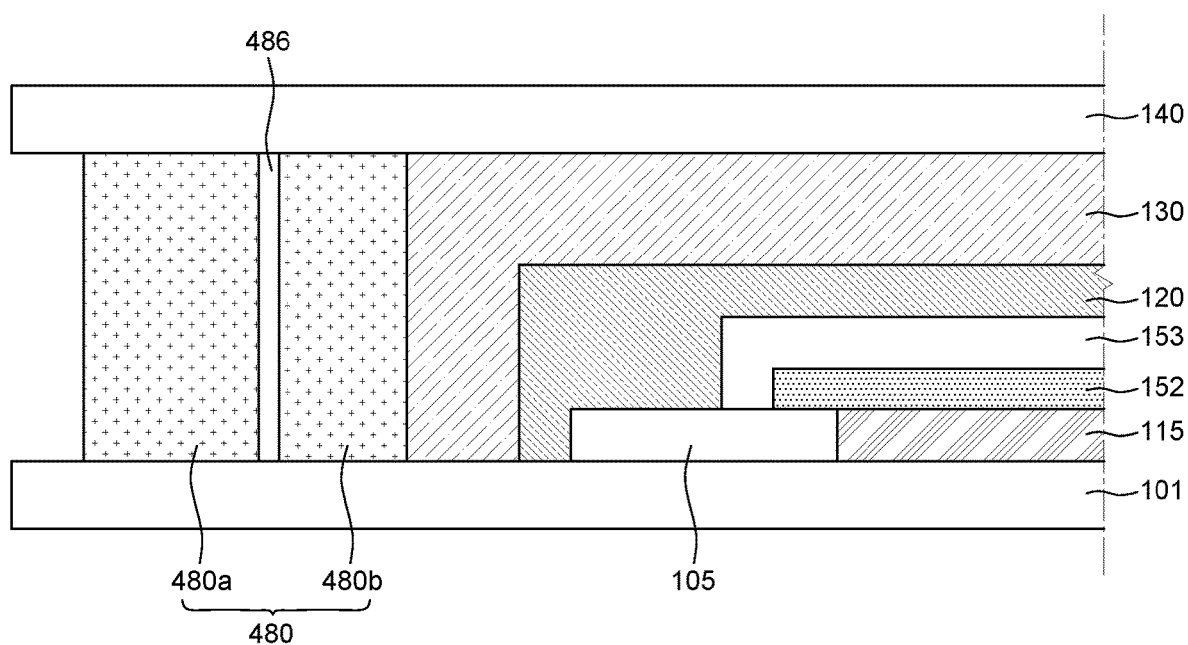
FIG. 8 is a cross-sectional view of an organic light emitting display device according to a fourth exemplary embodiment of the present disclosure.

FIG. 8 is a cross-sectional view of an organic light emitting display device according to a fourth exemplary embodiment of the present disclosure.

A fourth exemplary embodiment of the present disclosure of FIG. 8 has a configuration of a dam 480 different from that of the organic light emitting display device according to the third exemplary embodiment of the present disclosure of FIG. 7, but other configurations are substantially the same. Therefore, redundant description is omitted. The same configuration will be denoted with the same reference numeral.

Referring to FIG. 8, a dam 480 may be disposed between the substrate 101 and the encapsulation substrate 140 at an edge of the substrate 101.

The dam 480 according to the fourth exemplary embodiment of the present disclosure is configured by a dual dam including a first dam 480a and a second dam 480b provided in the first dam 480a.

Further, according to the fourth exemplary embodiment of the present disclosure, a buffer layer 486 is interposed between the first dam 480a and the second dam 480b. For example, the buffer layer 486 may be configured by an air layer, but is not limited thereto.

As the buffer layer 486 formed of air is interposed between the first dam 480a and the second dam 480b, the moisture permeation from the outside may be more effectively blocked.

The dam 480 may be formed to enclose the pixel unit 115 on the plane.

The dam 480 according to the fourth exemplary embodiment of the present disclosure may be configured with transparent materials to implement a transparent display device.

The dam 480 may include a sealant and a filler dispersed in the sealant.

The dam 480 may further include a spacer and a getter.

The dam 480 may further include a polymer light emitting material.

Figure 9:
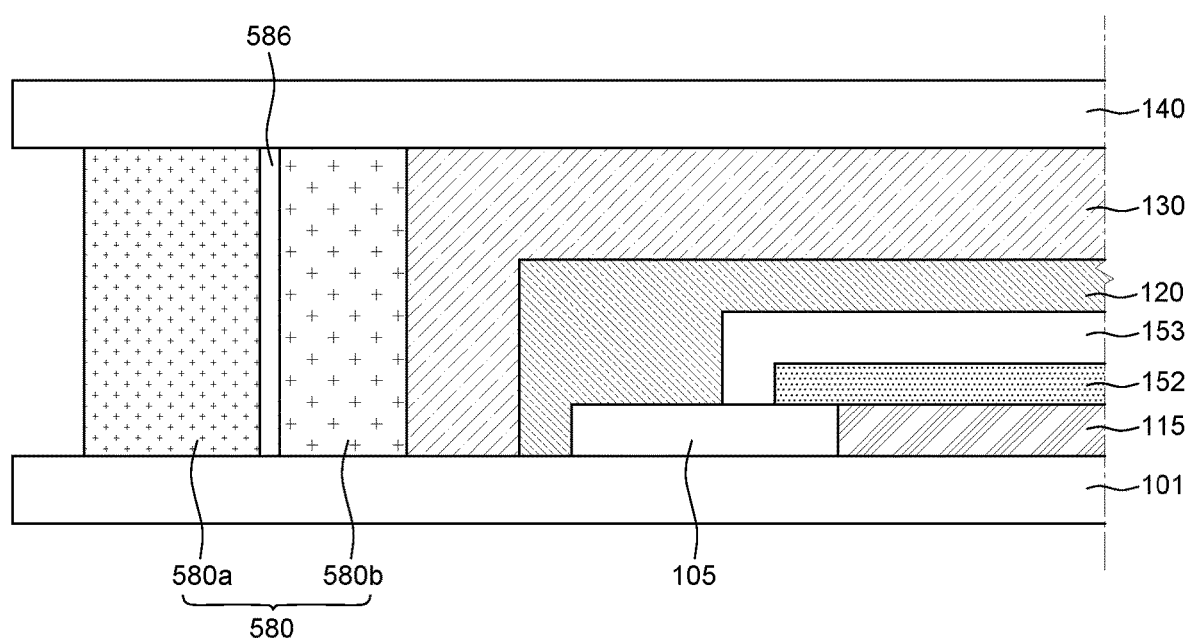
FIG. 9 is a plan view of an organic light emitting display device according to a fifth exemplary embodiment of the present disclosure.

FIG. 9 is a cross-sectional view of an organic light emitting display device according to a fifth exemplary embodiment.

A fifth exemplary embodiment of the present disclosure of FIG. 9 has a configuration of a dam 580 different from that of the organic light emitting display device according to the fourth exemplary embodiment of the present disclosure of FIG. 7, but other configurations are substantially the same. Therefore, redundant description is omitted. The same configuration will be denoted with the same reference numeral.

Referring to FIG. 9, a dam 580 may be disposed between the substrate 101 and the encapsulation substrate 140 at an edge of the substrate 101.

The dam 580 according to the fifth exemplary embodiment of the present disclosure is configured by a dual dam including a first dam 580a and a second dam 580b provided in the first dam 580a.

Further, according to the fifth exemplary embodiment of the present disclosure, a buffer layer 586 is interposed between the first dam 580a and the second dam 580b. For example, the buffer layer 586 may be configured by an air layer, but is not limited thereto.

As the buffer layer 586 formed of air is interposed between the first dam 580a and the second dam 580b, the moisture permeation from the outside may be more effectively blocked.

A width of the first dam 580a may be set in consideration of the moisture permeation distance. For example, when the measured moisture permeation distance is X, the first dam 580a may have a width longer than X.

The first dam 580a may include the polymer light emitting material more than that of the second dam 580b. That is, the first dam 580a may be utilized as an indicator for external appearance inspection and reliability evaluation of the transparent dam 580.

The dam 580 may be formed to enclose the pixel unit 115 on the plane.

The dam 580 according to the fifth exemplary embodiment of the present disclosure may be configured with transparent materials to implement a transparent display device.

The dam 580 may include a sealant and a filler dispersed in the sealant.

The dam 580 may further include a spacer and a getter.

The first dam 580a may further include a polymer light emitting material.

The exemplary embodiments of the present disclosure can also be described as follows:

According to an aspect of the present disclosure, there is provided an organic light emitting display device. The organic light emitting display device includes a substrate which is divided into an active area and a non-active area, an adhesive film and an encapsulation substrate disposed above the substrate and a dam disposed in the non-active area between the substrate and the encapsulation substrate, wherein the dam includes a polymer light emitting material that is transparent when irradiated with visible light but emits light when irradiated with ultraviolet light.

The organic light emitting display device may further include an organic light emitting diode which is disposed in the active area of the substrate and is configured by an anode, an organic layer, and a cathode and a passivation layer disposed on the organic light emitting diode.

The organic layer and the cathode may extend to the non-active area and the cathode may be disposed in the non-active area to cover the organic layer.

The passivation layer may extend to the non-active area and the passivation layer may be disposed in the non-active area to cover the cathode.

The adhesive film may be disposed on the passivation layer so as to cover the passivation layer.

The adhesive film may include a filler.

The dam may cover the active area at an edge of the non-active area.

The dam may include a sealant and a filler which may be dispersed in the sealant.

The dam may further include a spacer which limits a gap between the substrate and the encapsulation substrate.

The dam may further include a getter.

The sealant, the filler, the spacer, and the getter may be configured by a transparent material.

The polymer light emitting material may include polythiophene (PTh) and derivatives thereof, poly-p-phenylene (PPP) and derivatives thereof, polyfluorene (PF) and derivatives thereof, poly-p-phenylenevinylene (PPV) and derivatives thereof, and polyarylenevinylene (PAV) and derivatives thereof.

In the dam, the polymer light emitting material may be deteriorated due to absorption of moisture so that a permeation distance of the moisture may be visible.

According to another aspect of the present disclosure, there is provided an organic light emitting display device. The organic light emitting display device includes a substrate which is divided into an active area and a non-active area, an adhesive film and an encapsulation substrate disposed above the substrate, a dam disposed in the non-active area between the substrate and the encapsulation substrate and a light emitting layer disposed between the dam and the substrate.

The light emitting layer may include the polymer light emitting material.

The dam may include a first dam and a second dam disposed in the first dam.

The first dam and the second dam may be in contact with each other.

The organic light emitting display device may further include a buffer layer disposed between the first dam and the second dam.

The buffer layer may be configured by an air layer.

According to still another aspect of the present disclosure, there is provided an organic light emitting display device. The organic light emitting display device includes a substrate which is divided into an active area and a non-active area, an adhesive film and an encapsulation substrate disposed above the substrate and a dam disposed in the non-active area between the substrate and the encapsulation substrate, wherein the dam includes a first dam and a second dam disposed in the first dam and the first dam further includes a polymer light emitting material that is transparent when irradiated with visible light but emits light when irradiated with ultraviolet light compared to the second dam.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, comprising:
   a substrate that is divided into an active area and a non-active area;
   an adhesive film and an encapsulation substrate disposed above the substrate; and
   a dam disposed in the non-active area between the substrate and the encapsulation substrate,
   wherein the dam includes a polymer light emitting material that is transparent responsive to irradiation with external visible light but emits light responsive to irradiation with ultraviolet light and deteriorates responsive to absorption of moisture such that an amount of light emitted in response to said ultraviolet irradiation changes or does not emit light.

2. The organic light emitting display device according to claim 1, further comprising:
   an organic light emitting diode that is disposed in the active area of the substrate, the organic light emitting diode including an anode, an organic layer, and a cathode; and
   a passivation layer disposed on the organic light emitting diode.

3. The organic light emitting display device according to claim 2, wherein the organic layer and the cathode extend to the non-active area and the cathode is disposed in the non-active area, the cathode covering the organic layer.

4. The organic light emitting display device according to claim 3, wherein the passivation layer extends to the non-active area and the passivation layer is disposed in the non-active area, the passivation layer covering the cathode.

5. The organic light emitting display device according to claim 4, wherein the adhesive film is disposed on the passivation layer, the adhesive film covering the passivation layer.

6. The organic light emitting display device according to claim 1, wherein the adhesive film includes a filler.

7. The organic light emitting display device according to claim 1, wherein the dam covers the active area at an edge of the non-active area.

8. The organic light emitting display device according to claim 1, wherein the dam includes:
   a sealant; and
   a filler dispersed in the sealant.

9. The organic light emitting display device according to claim 8, wherein the dam further includes a spacer that limits a gap between the substrate and the encapsulation substrate.

10. The organic light emitting display device according to claim 9, wherein the dam further includes a getter.

11. The organic light emitting display device according to claim 10, wherein the sealant, the filler, the spacer, and the getter include a transparent material.

12. The organic light emitting display device according to claim 1, wherein the polymer light emitting material includes at least one of polythiophene (PTh) and derivatives thereof, poly-p-phenylene (PPP) and derivatives thereof, polyfluorene (PF) and derivatives thereof, poly-p-phenylenevinylene (PPV) and derivatives thereof, and polyarylenevinylene (PAV) and derivatives thereof.

13. An organic light emitting display device, comprising:
- a substrate that is divided into an active area and a non-active area;
- an adhesive film and an encapsulation substrate disposed above the substrate;
- a dam disposed in the non-active area between the substrate and the encapsulation substrate; and
- a light emitting layer disposed between the dam and the substrate,
- wherein the dam includes at least one material that is different from a material included in the light emitting layer, and
- wherein the dam includes a polymer light emitting material that is transparent responsive to irradiation with external visible light but emits light responsive to irradiation with ultraviolet light and deteriorates responsive to absorption of moisture such that an amount of light emitted in response to said ultraviolet irradiation changes or does not emit light.

14. The organic light emitting display device according to claim 13, wherein the light emitting layer includes a polymer light emitting material.

15. The organic light emitting display device according to claim 1, wherein the dam includes:
- a first dam; and
- a second dam disposed in the first dam.

16. The organic light emitting display device according to claim 15, wherein the first dam and the second dam contact each other.

17. The organic light emitting display device according to claim 15, further comprising:
- a buffer layer disposed between the first dam and the second dam.

18. The organic light emitting display device according to claim 17, wherein the buffer layer comprises an air layer.

19. An organic light emitting display device, comprising:
- a substrate that is divided into an active area and a non-active area;
- an adhesive film and an encapsulation substrate disposed above the substrate; and
- a dam disposed in the non-active area between the substrate and the encapsulation substrate,
- wherein the dam includes a first dam and a second dam disposed in the first dam such that the first dam is farther from the active area than the second dam, the first dam further including more of a polymer light emitting material than the second dam, the polymer light emitting material is transparent responsive to irradiation with external visible light but emits light responsive to irradiation with ultraviolet light and deteriorates responsive to absorption of moisture such that an amount of light emitted in response to said ultraviolet irradiation changes or does not emit light.

* * * * *